United States Patent [19]

Chen et al.

[11] Patent Number: 5,718,811
[45] Date of Patent: Feb. 17, 1998

[54] SPUTTER TEXTURED MAGNETIC RECORDING MEDIUM

[75] Inventors: Ga-Lane Chen, Fremont; Kwok H. Yuen, San Francisco, both of Calif.

[73] Assignee: Seagate Technology, Inc., Scotts Valley, Calif.

[21] Appl. No.: 608,072

[22] Filed: Feb. 28, 1996

[51] Int. Cl.[6] .................. G23C 14/34; B05D 5/12
[52] U.S. Cl. .................. 204/192.2; 204/192.15; 204/192.1; 427/129; 427/130; 427/131; 427/132
[58] Field of Search ............ 204/192.1, 192.15, 204/192.2; 427/127, 129, 130, 131, 132, 554, 555, 556, 557

[56] References Cited

U.S. PATENT DOCUMENTS

| | | | |
|---|---|---|---|
| 4,950,548 | 8/1990 | Furusawa et al. | 204/192.2 |
| 5,062,021 | 10/1991 | Ranjan et al. | 360/135 |
| 5,166,006 | 11/1992 | Lal et al. | 428/612 |
| 5,202,810 | 4/1993 | Nakamura et al. | 360/135 |
| 5,250,339 | 10/1993 | Tani et al. | 428/694 SG |
| 5,474,830 | 12/1995 | Yamaguchi et al. | 204/192.2 |
| 5,506,017 | 4/1996 | Ranjan et al. | 204/192.2 |

FOREIGN PATENT DOCUMENTS 61-187117  8/1986  Japan.

*Primary Examiner*—R. Bruce Breneman
*Assistant Examiner*—Rodney G. McDonald
*Attorney, Agent, or Firm*—Lowe, Price, LeBlanc & Becker

[57] ABSTRACT

A magnetic recording medium exhibiting improved glide and CSS characteristics is produced by depositing a metallic layer on a non-magnetic substrate, as by sputtering, so that the deposited metallic layer has a textured surface. In one embodiment, a Ti-base alloy layer having a textured surface comprising a plurality of relatively uniform protrusions is sputter-deposited directly onto a non-magnetic substrate, such as Ni-P coated aluminum-magnesium alloy substrate, or an electrically conductive graphite substrate, and a magnetic layer deposited on the sputtered metallic layer with or without a Cr underlayer.

56 Claims, 3 Drawing Sheets

SPUTTER TEXTURED MAGNETIC RECORDING MEDIUM

TECHNICAL FIELD

The present invention relates to the recording, storage and reading of magnetic data, particularly rotatable magnetic recording media, such as thin film magnetic disks having textured surfaces for contact with cooperating magnetic transducing heads. The invention has particular applicability to high density magnetic recording media exhibiting low noise, and reduced flying heights.

BACKGROUND ART

Magnetic disks and disk drives are conventionally employed for storing data in magnetizable form. Typically, one or more disks are rotated on a central axis in combination with data transducing heads positioned in close proximity to the recording surfaces of the disks and moved generally radially with respect thereto. Magnetic disks are usually housed in a magnetic disk unit in a stationary state with a magnetic head having a specific load elastically in contact with and pressed against the surface of the disk.

In operation, the magnetic disk is normally driven by the contact start stop (CSS) method, wherein the head begins to slide against the surface of the disk as the disk begins to rotate. Upon reaching a predetermined high rotational speed, the head floats in air at a predetermined distance from the surface of the disk due to dynamic pressure effects caused by the air flow generated between the sliding surface of the head and the disk. During reading and recording operations, the transducing head is maintained at a controlled distance from the recording surface, supported on a bearing of air as the disk rotates. The magnetic head unit is arranged such that the head can be freely moved in both the circumferential and radial directions of the disk in this floating state allowing data to be recorded on and retrieved from the surface of the disk at a desired position.

Upon terminating operation of the disk drive, the rotational speed of the disk decreases and the head begins to slide against the surface of the disk again and eventually stops in contact with and pressing against the disk. Thus, the transducing head contacts the recording surface whenever the disk is stationary, accelerated from a stop and during deceleration just prior to completely stopping. Each time the head and disk assembly is driven, the sliding surface of the head repeats the cyclic operation consisting of stopping, sliding against the surface of the disk, floating in the air, sliding against the surface of the disk and stopping.

It is considered desirable during reading and recording operations to maintain each transducing head as close to its associated recording surface as possible, i.e., to minimize the flying height of the head. This objective becomes particularly significant as the areal recording density increases. The areal density (Mbits/in$^2$) is the recording density per unit area and is equal to the track density (TPI) in terms of tracks per inch times (x) the linear density (BPI) in terms of bits per inch. Thus, a smooth recording surface is preferred, as well as a smooth opposing surface of the associated transducing head, thereby permitting the head and the disk to be positioned in closer proximity with an attendant increase in predictability and consistent behavior of the air bearing supporting the head. However, another factor operates against that objective. If the head surface and recording surface are too flat, the precision match of these surfaces gives rise to excessive stiction and friction during the start up and stopping phases, thereby causing wear to the head and recording surfaces eventually leading to what is referred to as a "head crash." Thus, there are competing goals of reduced head/disk friction and minimum transducer flying height.

In order to satisfy these competing objectives, the recording surfaces of magnetic disks are conventionally provided with a roughened surface to reduce the head/disk friction by techniques referred to as "texturing." Conventional texturing techniques involve polishing the surface of a disk substrate to provide a texture thereon prior to subsequent deposition of coatings, such as an underlayer, magnetic layer, carbon overcoat and lubricant topcoat, wherein the textured surface on the substrate is reproduced on the surface of the magnetic disk.

A typical magnetic recording medium is depicted in FIG. 1 and comprises a substrate 10, typically an aluminum (Al)-base alloy, such as an aluminum-magnesium (Al-Mg) alloy, plated with a layer of amorphous nickel-phosphorous (NiP). Substrate 10 typically contains sequentially deposited thereon a chromium (Cr) underlayer 11, a cobalt (Co)-base alloy magnetic layer 12, a protective carbon overcoat 13 and a lubricant topcoat 14. Cr underlayer 11, Co-base alloy magnetic layer 12 and protective carbon overcoat 13 are typically deposited by sputtering techniques. A conventional Al-alloy substrate is provided with a NiP plating primarily to increase the hardness of the Al substrate, serving as a suitable surface for polishing to provide the requisite surface roughness or texture, which is substantially reproduced on the disk surface.

The escalating requirements for high areal recording density impose increasingly greater requirements on thin film magnetic media in terms of coercivity, stiction squareness, low medium noise and narrow track recording performance. In addition, increasingly high density and large-capacity magnetic disks require increasingly small flying heights, i.e., the distance by which the head floats above the surface of the disk in the CSS drive. The requirement to further reduce the flying height of the head imposed by increasingly higher recording density and capacity render it particularly difficult to satisfy the requirements for controlled texturing to avoid head crash.

Conventional techniques for providing a disk substrate with a textured surface comprise a mechanical operation, such as polishing. See, for example, Nakamura et al., U.S. Pat. No. 5,202,810. Conventional mechanical texturing techniques are attendant with numerous disadvantages. For example, it is extremely difficult to provide a clean textured surface due to debris formed by mechanical abrasions. Moreover, the surface inevitably becomes scratched during mechanical operations, which contributes to poor glide characteristics and higher defects. In addition, various desirable substrates are difficult to process by mechanical texturing. This undesirably limiting facet of mechanical texturing, virtually excludes the use of many inexpensive substrates as well as conductive graphite substrates which facilitate achieving high coercivities.

Alternative texturing techniques to mechanical processing have been attempted. One such alternative to mechanical texturing involves the use of lasers. See, for example, Ranjan et al., U.S. Pat. No. 5,062,021. Another alternative to mechanical texturing is disclosed by Lal et al., U.S. Pat. No. 5,166,006, and involves chemical etching. Such alternative techniques have proven less than successful, in that it is extremely difficult to provide repeatable and controllable textured patterns on non-metallic substrates, such as glass, glass-ceramic materials and electrically conductive graphites.

Accordingly, there exists a need for magnetic recording media with repeatable and controllable textured surface patterns exhibiting improved floating characteristics and improved sliding-wear-resistant characteristics, low noise and high coercivity. There also exists a need for a method of manufacturing a magnetic recording media without the above-discussed disadvantages and limitations of conventional texturing techniques, such as mechanical texturing, which method is applicable to a variety of substrates, including electrical conductive graphite substrates.

DISCLOSURE OF THE INVENTION

An object of the present invention is a textured magnetic recording medium exhibiting low noise, high coercivity, improved flying characteristics and improved sliding-wear-resistant characteristics.

Another object of the present invention is a method of manufacturing a textured magnetic recording medium exhibiting low noise, high coercivity, improved floating characteristics and improved sliding-wear-resistant characteristics.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a magnetic recording medium comprising: a non-magnetic substrate; a sputtered metallic layer formed on the substrate, which sputter metallic layer has a textured surface comprising a plurality of protrusions; and a magnetic layer formed on the sputtered metallic layer.

Another aspect of the present invention is a magnetic recording medium comprising: a substrate; a sputtered layer of Ti or a Ti-base alloy formed on the substrate, which sputtered layer has a textured surface comprising a plurality of protrusions; and a magnetic layer formed on the sputtered layer.

A further object of this invention is a method of manufacturing a magnetic recording medium, which method comprises: depositing a metallic layer on a non-magnetic substrate so that the deposited magnetic layer has a textured surface comprising a plurality of protrusions; and forming a magnetic layer on the deposited metallic layer.

Another aspect of the present invention is a method of manufacturing a magnetic recording medium, which method comprises: sputter depositing a metallic layer on a non-magnetic substrate, so that the sputtered metallic layer has a textured surface comprising a plurality of protrusions; and forming a magnetic layer on the sputtered metallic layer.

Another aspect of the present invention is a method of manufacturing a magnetic recording medium, which method comprises: sputter depositing a Ti or Ti-base alloy on a non-magnetic substrate, so that the sputtered Ti or Ti-base alloy has a textured surface comprising a plurality of protrusions; and forming a magnetic layer on the sputtered Ti or Ti-base layer.

Additional objects and advantages of the present invention will become readily apparent to those skilled in this art from the following detailed description, wherein the embodiments of the invention are described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
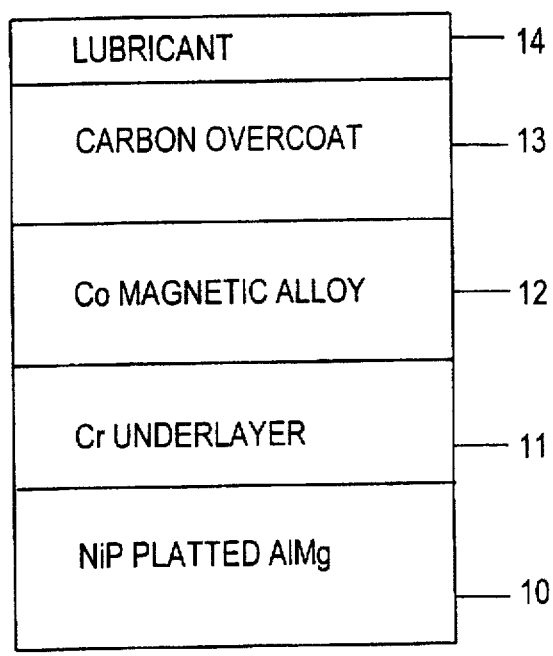
FIG. 1 schematically depicts a conventional magnetic recording medium structure.

The present invention provides a textured magnetic recording medium having high coercivity, low noise, improved flying characteristics and improved sliding-wear-resistant characteristics, by an efficient, cost-effective method which can be easily integrated into conventional manufacturing methodology. Moreover, the present invention provides a magnetic recording medium having a relatively uniform and controllable surface texture by a method which eliminates the disadvantages attendant upon conventional texturing techniques, such as mechanical processing. Advantageously, the present invention is applicable to a wide variety of substrate materials, such as glass, glass-ceramic materials and, significantly, electrically conductive graphite substrates.

In accordance with the present invention, a non-magnetic substrate is provided with a textured surface by depositing, as by sputtering, a metallic layer thereon, so that the sputtered metallic layer has a surface texture comprising a plurality of protrusions with a relatively uniform and controllable size and distribution. The textured surface of relatively uniform protrusions is reproduced on the surface of the magnetic recording medium through the subsequently applied layers, such as an underlayer, magnetic layer, carbon overcoat and lubricant topcoat. The sputtered metallic layer having protrusions extending therefrom is referred to herein as a "bump layer."

In an embodiment of the present invention, a bump layer is advantageously sputter deposited directly on a non-magnetic substrate, without the need of a seed layer. Thus, in accordance with the present invention, a bump layer is sputter-deposited by controlling the process parameters, without regard to the relative surface characteristics of the substrate vis-à-vis the sputtered layer.

The bump layer of the present invention can be advantageously deposited on a wide variety of substrates, such as conventional NiP plated Al-base alloy substrates as well as glass, glass-ceramic materials and, electrically conductive graphites. The general applicability of the present invention to a wide variety of substrates offers the economic advantage of selecting relatively shock-resistant glass and glass-ceramic substrates. Glass and glass-ceramic substrates have higher shock resistance and can avoid head slapping problems. Glass and glass-ceramic substrates are, therefore, suitable for hard disk drive designs for portable computer applications. In addition, magnetic recording media exhibiting higher coercivities can be produced in accordance with the present invention by employing an electrically conductive graphite substrate.

In accordance with the present invention, a bump layer is formed on a non-magnetic substrate to provide a textured surface comprising a substantially uniform pattern of controlled protrusions. Advantageously, the protrusions are controlled to a diameter of about 2 to about 10 microns, and to a height of about 30 to slightly in excess of about 100 Å. The bump layer of the present invention can also be/sputtered on metallic substrates, such as Al with or without a Cr underlayer. Thus, the bump layer of the present invention can be applied directly to a conventional substrate comprising an Al-base alloy plated with NiP.

After extensive experimentation, it was found that a sputtered metallic bump layer can be formed on various substrates without regard to the particular material of the substrate. More particularly, it was discovered that a texture comprising a plurality of substantially uniform protrusions can be sputter deposited, and the shape and distribution of the protrusions controlled by appropriate adjustment of process parameters, such as the heat input to the substrate and the thickness of the sputtered metallic layer prior to formation of the protrusions. The heat input to the substrate can be controlled by various techniques, as by controlling the speed at which the substrate is passed in proximity to a radiant heater, periodic application of heat energy, induction heating and pulsed laser heating. The particular type of heating means employed can be selected with due consideration to the substrate material.

The optimum thickness of the sputtered metallic layer conducive to formation of protrusions can be determined by controlling the target power during sputtering and substrate travel speed. It was found particularly advantageous to eschew the application of a bias on the metallic target during sputtering. The application of a bias to a metallic target, particularly a Ti or Ti-base alloy target, diminishes the formation of protrusions and renders them irregular in shape and distribution.

In an embodiment of the present invention, titanium (Ti) or a titanium-base alloy is sputter deposited on a variety of substrates, such as a NiP-plated Al substrate or an electrically conductive graphite substrate. The sputtered Ti or Ti-base alloy bump layer has a controlled thickness and a controlled pattern of protrusions extending therefrom.

With knowledge of the relevant result effective variables, i.e., substrate heating rate and thickness of the sputtered metallic layer prior to formation of protrusions, one having ordinary skill in the art could easily optimize such process parameters for a particular application. For example, a NiP plated Al alloy substrate should be heated to a temperature of less than the NiP magnetization temperature of about 280° C., such as between about 80° C. and about 275° C. When depositing Ti or a Ti-base alloy, the thickness of the Ti-containing layer can be advantageously controlled between about 600 Å to about 1300 Å.

In conventional manufacturing practices, a plurality of substrates are provided on a pallet, and various layers of the magnetic recording medium sequentially sputtered thereon, e.g., underlayer, magnetic layer and carbon overcoat. Accordingly, in accordance with the present invention, the heat input to the substrate can be controlled by varying the pallet travel speed as it passes in proximity to a heating source, such as a quartz radiant heater.

Figure 2:
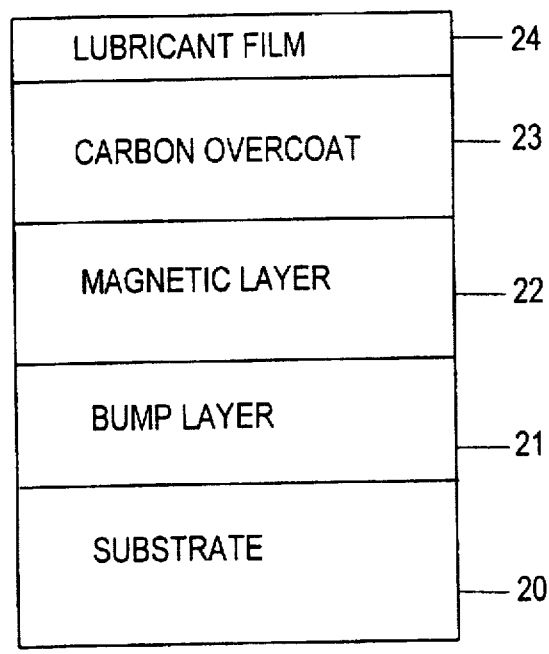
FIG. 2 schematically depicts a magnetic recording medium structure in accordance with the present invention.
Figure 3:
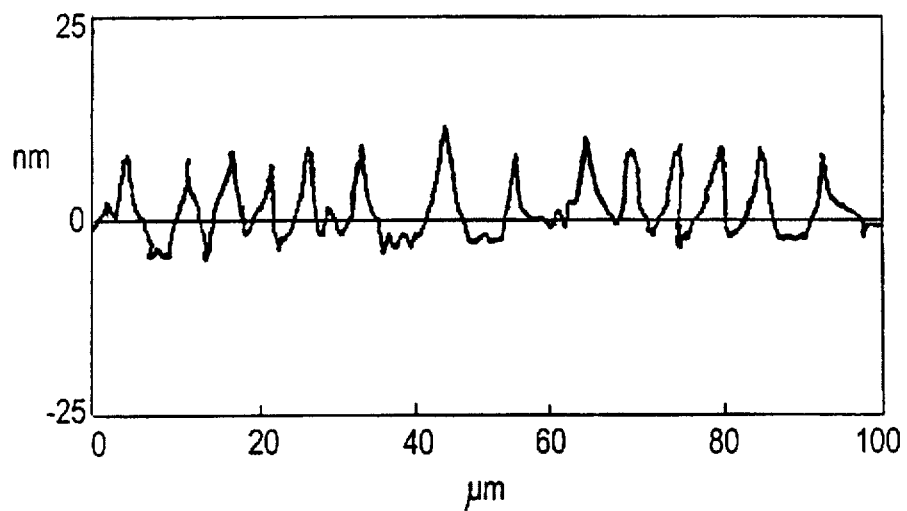
FIG. 3 illustrates a cross-sectional view of a line scan of the sputtered textured surface deposited in accordance with the present invention.
Figure 4:
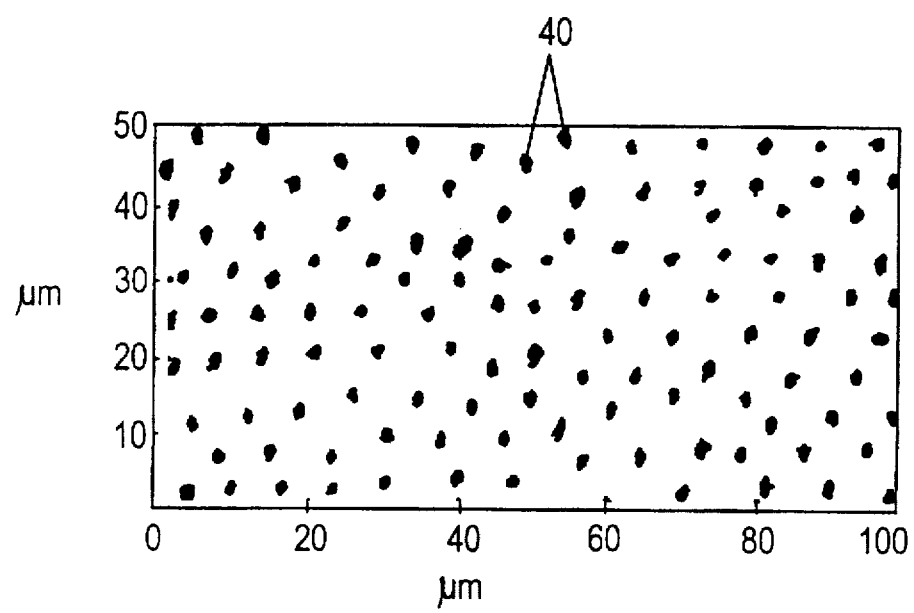
FIG. 4 illustrates a top view of the sputtered textured surface formed in accordance with the present invention.

An embodiment of the present invention is schematically depicted in FIG. 2, wherein bump layer 21 of a Ti-base alloy is sputter-deposited directly on substrate 20. The bump layer is itself comprises a uniform layer of the Ti-base alloy with protrusions extending therefrom to form a substantially uniform controlled textured surface. Magnetic layer 22 and carbon overcoat 23 are sequentially deposited by sputtering. Lubricant topcoat 24 is then applied. A Cr underlayer (not shown) can be optionally deposited on bump layer 21 and magnetic layer 22 deposited on the Cr underlayer. The optional Cr underlayer can have a thickness of about 500 Å to about 2000 Å; the magnetic layer can have a thickness of about 150 Å to about 600 Å. In accordance with the present invention, bump layer 21 has a textured surface comprising a relative uniform distribution of bumps or protrusions having a substantially uniform size and height. This textured surface is reproduced through subsequently applied optional Cr underlayer, magnetic layer 22, carbon overcoat 23 and lubricant film 24. The sputtered textured surface of the bump layer in accordance with the present invention can be appreciated from the cross-sectional line scan illustrated in FIG. 3, and top view of the sputtered textured surface illustrated in FIG. 4 comprising a substantially uniform distribution of protrusions 40.

During further extensive experimentation, it was found that protrusion formation is enhanced by heating the substrate in a dynamic manner to create a temperature gradient across the surface of the substrate. Thus, when depositing a Ti or Ti-base alloy on a NiP plated Al-base substrate in accordance with the present invention, the substrate is moved by a heating source, such as a quartz silicon radiant heater, at a speed sufficient to elevate the substrate to the desired temperature range. The optimum pallet speed can be determined in a particular situation to achieve a desired temperature gradient.

It was found that Ti-base alloy protrusions are generally larger and less dense with a higher temperature gradient, and smaller and less dense with a lower temperature gradient on a NiP plated substrate surface. A high temperature gradient can be achieved by increasing the pallet speed, while a lower temperature gradient can be achieved by reducing the pallet speed. The thickness of the sputtered Ti-base alloy layer prior to formation of protrusions can be controlled to produce higher and larger bumps by increasing the Ti-base alloy target power at a fixed pallet speed.

The exact mechanism by which dynamic heating contributes to or enhances the formation of protrusions during sputtering is not known. However, it is believed that protrusion formation depends on localized heating/cooling of the substrate, i.e., a localized temperature gradient effect. As a maximum localized temperature gradient is established, the metal, such as Ti, becomes sufficiently mobile to grow and form larger protrusions. Lateral growth is more rapid than vertical growth due to the effects of surface tension, thereby decreasing the density of protrusions. However, increasing power input appears to cause the localized temperature gradient to drop and, hence, the protrusions become smaller and denser. The protrusions appear to decrease with lower target power and/or higher pallet speed.

In accordance with the present invention, a magnetic recording medium is provided which exhibits a relatively uniform texture so that sub-micro-inch glide performance for a substrate smoothness less than about 5 Å and CSS performance equivalent to a mechanically textured disk with a center line average surface roughness (Ra) of in excess of 30 Å is achieved. Generally, the magnetic recording medium in accordance with the present invention exhibits a center line average surface roughness (Ra) of about 7 Å to about 32 Å, and a surface peak roughness (Rp) of about 30 Å to about 200 Å. The magnetic media formed in accordance with the present invention, therefore, exhibit desirable glide characteristics and CSS performance.

In accordance with the present invention, a suitable magnetic layer, such as a Co-base layer, can be applied directly to the bump layer or applied to a Cr underlayer formed on the bump layer. Advantageously, coercivities of at least 2,000 Oersteds, are easily achieved. In an embodiment of the present invention, a CoCrPtTa magnetic layer is applied directly to a Ti bump layer by sputtering. In another embodiment of the present invention, after formation of the Ti bump layer, the substrate is reheated and a Co-Cr-Ta magnetic layer applied by sputtering.

Experimentation was conducted wherein a Ti-base alloy was sputter deposited on a NiP plated Al-base alloy substrate at an overall temperature of about 80° C., by moving a pallet containing the substrate in close proximity to a radiant heater operated at 10% power input at a pallet speed of approximately three feet per minute. Ti-base alloy protrusions appear to increase in size, but not in height, and increase in density as the pass-by heating increase from 15% to 25% power input. Further experimentation revealed that Ti-base alloy protrusions decrease in size, but not in height, and increase in density at 30% power input. Thus, for a particular situation, the amount of the heat input and pallet speed can be varied to control the size and distribution of protrusions.

EXAMPLE

Glide tests were performed on two groups of sputter textured disks under the following conditions:

pass-by settings at 25% power and 6 feet per minute;

Ti settings at 3.5 Kw and 5.5 Kw;

pallet speeds at 1 foot per minute.

Sputter textures were applied on two substrate surfaces: one a polished NiP plated Al-base alloy; and the other having a Cr coating on the polished NiP plating. The GHA (Glide Height Avalanche) test results are plotted in the graph shown in FIG. 5, as the RMS (Root Mean Square) in millivolts (vertical axis) vs. the FHT (Flying Height Test) in micro inches (horizontal axis).

Figure 5:
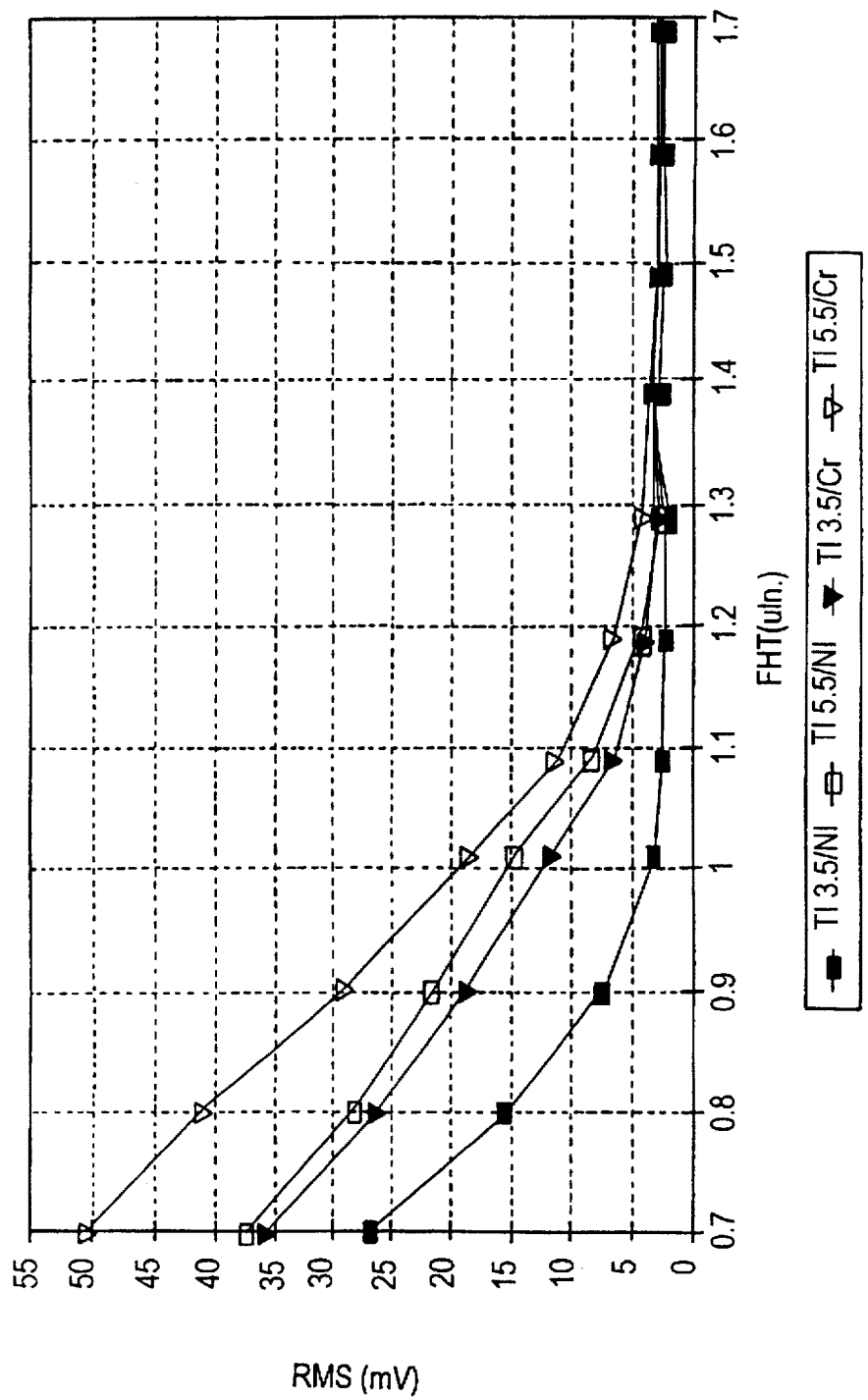
FIG. 5 represents a graph showing the results of glide testing on sputter textured disks in accordance with the present invention.

It is observed from FIG. 5 that the roughness induced by the Cr coating results in increased glide avalanche in both the 3.5 Kw and 5.5 Kw target settings. The glide avalanche for the 3.5 Kw Ti protrusion over the Ni plated substrate is about 1.0–1.1 micro inch, and for that of the 5.5 Kw protrusion about 1.2–1.3 micro inch. Thus, the glide avalanche on sputter textured disks depends on the protrusion height, which can be controlled with pass-by heating, target power and pallet speed.

The use of a sputtering technique for texturing a magnetic recording medium to achieve sub-micro inch glide and desirable CSS performance is economically advantageous, in that sputter texturing is easily integrated into conventional fabrication methodology in which underlayers, magnetic layers and carbon overcoats are typically deposited by sputtering. Advantageously, the bump layer of the present invention can be sputter deposited employing conventional sputtering equipment, with sputter gases such as argon, nitrogen, oxygen, or a mixture thereof. Moreover, the use of sputtering eliminates magnetic defects and mechanical texturing steps, thereby improving throughput and yield. Additionally, the present invention is applicable to a wide variety of substrate materials, such as glass, glass-ceramic materials or electrically conductive graphite. Glass-ceramic materials are typically formed by a heat treatment of the surface to form a thin crystallized layer of ceramic thereon. Electrically conductive graphites are desirable for obtaining disk with high coercivity.

Any magnetic alloy conventionally employed in the production of magnetic recording media can be employed in producing the magnetic recording media of the present invention. Such conventional magnetic alloys, include, but are not limited to, cobalt (Co)-base alloys, such as cobalt-chromium (CoCr), cobalt-samarium (CoSm), cobalt-chromium-tantalum (CoCrTa), cobalt-nickel-chromium (CoNiCr), cobalt-chromium-samarium (CoCrSm), cobalt-chromium-platinum-tantalum (CoCrPtTa), cobalt-chromium-platinum (CoCrPt), cobalt-nickel-platinum (CoNiPt), cobalt-nickel-chromium-platinum (CoNiCrPt) and cobalt-chromium-platinum-boron (CoCrPtB). The thickness of the magnetic layer is consistent with conventional practices and manufacturing a magnetic recording medium. Cobalt-base alloys having a thickness of about 100 Å to about 1000 Å, such as 200 Å to about 500 Å, has been found suitable.

The present invention is not limited to the particular materials disclosed herein. Various metals, apart from Ti and Ti-base alloys can be employed in sputter depositing a bump layer on various substrates, and any of various magnetic materials applied to the bump layer with or without an intervening underlayer. In accordance with the present invention, a carbon overcoat of suitable thickness, such as about 75 Å to about 200 Å, can be deposited on the magnetic layer. In addition, a lubricant topcoat of suitable thickness, such as about 10 Å to about 30 Å, can be deposited on the carbon overcoat. The present invention, therefore, provides an efficient method for forming magnetic recording media having reproducible and uniform surface characteristics with desirable glide performance and improved CSS performance.

Only certain embodiments of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a magnetic recording medium, which method comprises:

sputter depositing a titanium layer on a non-magnetic substrate so that the deposited titanium layer has a textured surface comprising a plurality of protrusions having a height of about 30 Å to about 100 Å; and forming a magnetic layer on the deposited titanium layer.

2. The method according to claim 1, comprising sputter depositing the titanium layer under conditions such that it exhibits a glide avalanche of about 1.0 to about 1.3 micro inch.

3. The method according to claim 1, comprising sputter depositing the titanium layer directly on the substrate.

4. The method according to claim 1, wherein the substrate comprises an aluminum-base alloy plated with nickel-phosphorous, carbon, a glass or a glass-ceramic material.

5. The method according to claim 4, wherein the substrate comprises electrically conductive graphite.

6. The method according to claim 1, comprising heating the substrate to a temperature of less than about 275° C. and sputter depositing a titanium layer having a thickness of about 600 Å to about 1300 Å, thereby forming the textured surface comprising a plurality of protrusions.

7. The method according to claim 6, wherein the sputtered titanium layer comprises protrusions having a diameter of about 2 to about 10 microns.

8. The method according to claim 1, comprising: continuously moving the substrate in proximity to a radiant heater, thereby heating the substrate to a temperature of about 80° C. to about 270° C.; and sputter depositing the titanium layer on the heated substrate.

9. The method according to claim 1, comprising periodically heating the substrate to a temperature of about 80° C. to about 270° C.; and sputter depositing the titanium on the heated substrate.

10. The method according to claim 9, comprising induction heating the substrate.

11. The method according to claim 9, comprising heating the substrate with a pulsed laser beam.

12. The method according to claim 1, comprising forming a magnetic cobalt-base alloy layer having a coercivity of at least 2,000 Oersteds on sputtered titanium layer.

13. The method according to claim 12, wherein the cobalt-base alloy comprises platinum and tantalum.

14. The method according to claim 12, comprising heating the substrate subsequent to sputter-forming the titanium layer thereon; and depositing a magnetic cobalt-base alloy layer on the heated substrate.

15. The method according to claim 14, wherein the cobalt-base alloy layer comprises chromium, platinum and tantalum, and has a thickness of about 150 Å to about 600 Å.

16. The method according to claim 1, wherein the magnetic layer has a center line average surface roughness (Ra) of about 7 Å to about 32 Å, and a surface peak roughness (Rp) of about 30 Å to about 200 Å.

17. The method according to claim 1, further comprising forming a carbon overcoat having a thickness of about 75 Å to about 200 Å on the magnetic layer.

18. The method according to claim 17, further comprising forming a lubricant topcoat having a thickness of about 10 Å to about 30 Å on the carbon overcoat.

19. The method according to claim 1, comprising depositing a chromium underlayer having a thickness of about 500 Å to about 2000 Å on the sputtered metallic layer, and depositing the magnetic layer on the chromium underlayer.

20. A method of manufacturing a magnetic recording medium, which method comprises sequentially:

periodically heating a non-magnetic substrate to a temperature of about 80° C. to about 270° C.;

sputter depositing a metallic layer, comprising titanium or a titanium-base alloy, on the non-magnetic substrate so that the deposited metallic layer has a textured surface comprising a plurality of protrusions having a height of about 30 Å to about 100 Å; and forming a magnetic layer on the deposited metallic layer.

21. The method according to claim 20, comprising sputter depositing the metallic layer under conditions such that it exhibits a glide avalanche of about 1.0 to about 1.3 micro inch.

22. The method according to claim 20, comprising sputter depositing a titanium layer on the substrate.

23. The method according to claim 20, comprising sputter depositing the titanium or titanium-base alloy layer directly on the substrate.

24. The method according to claim 20, wherein the substrate comprises an aluminum-base alloy plated with nickel-phosphorous, carbon, a glass or a glass-ceramic material.

25. The method according to claim 24, wherein the substrate comprises electrically conductive graphite.

26. The method according to claim 20, comprising heating the substrate to a temperature of less than about 275° C. and sputter depositing a titanium or titanium-base alloy layer having a thickness of about 600 Å to about 1300 Å.

27. The method according to claim 26, wherein the sputtered titanium or titanium-base alloy layer comprises protrusions having a diameter of about 2 to about 10 microns.

28. The method according to claim 20, comprising: continuously moving the substrate in proximity to a radiant heater, thereby heating the substrate to a temperature of about 80° C. to about 270° C.; and sputter depositing the titanium or titanium-base alloy layer on the heated substrate.

29. The method according to claim 20, comprising induction heating the substrate.

30. The method according to claim 20, comprising heating the substrate with a pulsed laser beam.

31. The method according to claim 20, comprising forming a magnetic cobalt-base alloy layer having a coercivity of at least 2,000 Oersteds on the sputtered metallic layer.

32. The method according to claim 31, wherein the cobalt-base alloy comprises platinum and tantalum.

33. The method according to claim 31, comprising:

heating the substrate subsequent to sputter-forming the metallic layer thereon; and depositing a magnetic cobalt-base alloy layer on the heated substrate.

34. The method according to claim 33, wherein the cobalt-base alloy layer comprises chromium, platinum and tantalum, and has a thickness of about 150 Å to about 600 Å.

35. The method according to claim 20, wherein the sputtered magnetic layer has a center line average surface roughness (Ra) of about 7 Å to about 32 Å, and a surface peak roughness (Rp) of about 30 Å to about 200 Å.

36. The method according to claim 20, further comprising forming a carbon overcoat having a thickness of about 75 Å to about 200 Å on the magnetic layer.

37. The method according to claim 36, further comprising forming a lubricant topcoat having a thickness of about 10 Å to about 30 Å on the carbon overcoat.

38. The method according to claim 20, comprising depositing a chromium underlayer having a thickness of about 500 Å to about 2000 Å on the sputtered metallic layer, and depositing the magnetic layer on the chromium underlayer.

39. A method of manufacturing a magnetic recording medium, which method comprises:

sputter depositing a titanium layer on a non-magnetic substrate so that the deposited titanium layer has a textured surface comprising a plurality of protrusions having a height of about 30 Å to about 100 Å; and forming a magnetic cobalt-base alloy layer having a coercivity of at least 2,000 Oersteds on the sputtered titanium layer.

40. The method according to claim 39, comprising sputter depositing the titanium layer under conditions such that it exhibits a glide avalanche of about 1.0 to about 1.3 micro inch.

41. The method according to claim 39, comprising sputter depositing the titanium layer directly on the substrate.

42. The method according to claim 39, wherein the substrate comprises an aluminum-base alloy plated with nickel-phosphorous, carbon, a glass or a glass-ceramic material.

43. The method according to claim 42, wherein the substrate comprises electrically conductive graphite.

44. The method according to claim 39, comprising heating the substrate to a temperature of less than about 275° C. and sputter depositing the titanium layer having a thickness of about 600 Å to about 1300 Å.

45. The method according to claim 44, wherein the sputtered titanium layer comprises protrusions having a diameter of about 2 to about 10 microns.

46. The method according to claim 39, comprising: continuously moving the substrate in proximity to a radiant heater, thereby heating the substrate to a temperature of about 80° C. to about 270° C.; and sputter depositing the titanium layer on the heated substrate.

47. The method according to claim 39, comprising periodically heating the substrate to a temperature of about 80° C. to about 270° C.; and sputter depositing the titanium layer on the heated substrate.

48. The method according to claim 47, comprising induction heating the substrate.

49. The method according to claim 47, comprising heating the substrate with a pursed laser beam.

50. The method according to claim 39, wherein the cobalt-base alloy comprises platinum and tantalum.

51. The method according to claim 39, comprising:

heating the substrate subsequent to sputter-forming the titanium layer thereon; and depositing a magnetic cobalt-base alloy layer on the heated substrate.

52. The method according to claim 51, wherein the cobalt-base alloy layer comprises chromium, platinum and tantalum, and has a thickness of about 150 Å to about 600 Å.

53. The method according to claim 39, wherein the sputtered magnetic layer has a center line average surface roughness (Ra) of about 7 Å to about 32 Å, and a surface peak roughness (Rp) of about 30 Å to about 200 Å.

54. The method according to claim 39, further comprising forming a carbon overcoat having a thickness of about 75 Å to about 200 Å on the magnetic layer.

55. The method according to claim 54, further comprising forming a lubricant topcoat having a thickness of about 10 Å to about 30 Å on the carbon overcoat.

56. The method according to claim 39, comprising depositing a chromium underlayer having a thickness of about 500 Å to about 2000 Å on the sputtered titanium layer, and depositing the magnetic layer on the chromium underlayer.

* * * * *